United States Patent [19]

Hubacher

[11] Patent Number: 5,536,677

[45] Date of Patent: Jul. 16, 1996

US005536677A

[54] METHOD OF FORMING CONDUCTIVE BUMPS ON A SEMICONDUCTOR DEVICE USING A DOUBLE MASK STRUCTURE

[75] Inventor: Eric M. Hubacher, Austin, Tex.

[73] Assignee: Motorola, Inc., Schaumburg, Ill.

[21] Appl. No.: 348,009

[22] Filed: Dec. 1, 1994

[51] Int. Cl.$^6$ .................... H01L 21/285; H01L 21/321
[52] U.S. Cl. .................... 437/183; 437/228; 437/948; 437/962; 228/180.22
[58] Field of Search .................... 437/183, 948, 437/962, 155, 228 M; 228/180.22; 148/DIG. 105, DIG. 106, DIG. 104, DIG. 102

[56] References Cited

U.S. PATENT DOCUMENTS

| | | | |
|---|---|---|---|
| 4,334,349 | 6/1982 | Aoyama et al. | 29/579 |
| 4,353,935 | 10/1982 | Symersky | 427/89 |
| 4,895,811 | 1/1990 | Inoue | 437/41 |
| 5,219,117 | 6/1993 | Lin | 228/253 |
| 5,268,068 | 12/1993 | Cowell et al. | 156/664 |

FOREIGN PATENT DOCUMENTS

| | | |
|---|---|---|
| 59-21045 | 2/1984 | Japan . |
| 60-120540 | 6/1985 | Japan . |
| 60-254752 | 12/1985 | Japan . |
| 2165633 | 6/1990 | Japan . |
| 41144191 | 5/1992 | Japan . |
| 629298 | 2/1994 | Japan . |

OTHER PUBLICATIONS

"Process for Forming a High–Aspecfratio Solder Wterconnection"; *IBM TDB*, vol. 32, No. 6B, Nov. 1989, p. 180.
Motorola; C4 Product Design Manual; vol. 1: Chip and Wafer Design; Chapter 8—Bump Mask Design; pp. 8-1—8-2 (1992).
R. Tummala, et al.; IBM; Microelectronics Packaging Handbook; Ch. 6.3: Controlled Collapse Chip Connection (C4); pp. 366–391 (1989).

*Primary Examiner*—George Fourson
*Assistant Examiner*—David E. Graybill
*Attorney, Agent, or Firm*—Patricia S. Goddard

[57] ABSTRACT

A method for forming conductive bumps (60, 62) on a semiconductor device (50) using a mask structure (20) employs two masks (22, 24) individually fabricated and positioned in a back-to-back relationship. Each mask is patterned and isotropically etched to form a plurality of tapered openings (30, 40) corresponding to a pattern of terminal pads (54) on the semiconductor device. Metal is evaporated through the openings and onto the terminal pads. The mask structure is removed and the remaining metal is reflowed to form the conductive bumps. Using a mask structure having two individual masks (each with a thickness of one-half a typical mask thickness) enables smaller openings to be etched in each mask. Upon joining the two masks, the effective aspect ratio of the mask structure is reduced to produce smaller and denser conductive bumps without loss of volume and height control.

17 Claims, 2 Drawing Sheets

METHOD OF FORMING CONDUCTIVE BUMPS ON A SEMICONDUCTOR DEVICE USING A DOUBLE MASK STRUCTURE

FIELD OF THE INVENTION

The present invention relates generally to semiconductor devices, and more particularly to methods for forming conductive bumps on semiconductor devices.

BACKGROUND OF THE INVENTION

Forming conductive bumps on input and output terminal pads of semiconductor devices for the purpose of flip chip mounting is becoming more common. With an ever increasing demand for semiconductor devices with small foot prints, flip chip mounting is expected to increase in popularity, leaving the market for wire bonded and leaded semiconductor devices diminished. One known method for forming conductive bumps in flip chip applications is a technique wherein metal is evaporated onto a device's input and output terminal pads, and subsequently reflowed to form the conductive bumps. The evaporation is performed selectively, such that metal is only evaporated on the terminal pads and not on other portions of the device. The selectivity is accomplished through the use of an evaporation mask. Typically, the mask is a metal mask formed of, for example, molybdenum. The metal mask is patterned using conventional lithography and etching techniques to form openings through the mask which correspond to the pattern of terminals on the device onto which metal is to be deposited. While evaporation through a metal mask has found success in the formation of conductive bumps on semiconductor devices, the process has a significant limitation pertaining to the dimensions of the holes formed in the mask. This limitation and a further explanation of the metal mask technology is explained below in reference to FIG. 1 and FIG. 2.

FIG. 1 is a perspective view of a metal mask 10 used for forming conductive bumps on a semiconductor device. As illustrated mask 10 includes a plurality of openings 12 which extend through the entire thickness of the mask. The pattern of openings 12 correspond to the pattern of terminals on the semiconductor device onto which metal will be deposited through the mask. Mask 10 is typically patterned with openings to permit bumping of an entire semiconductor wafer having a plurality of die; however, for ease of illustration the individual die bump patterns are not delineated in FIG. 1. An exploded cross-sectional view of mask 10 taken along the line 2—2 is shown in FIG. 2. Openings 12 extend through the entire mask thickness, illustrated as "t". As illustrated in FIG. 2, each opening has an hourglass shape rather than being cylindrical with vertical sidewalls. The hourglass shape serves an important purpose of controlling the height and volume of metal used to form the conductive bumps. Having a uniform height and volume of conductive material on the terminals of the semiconductor device is important to achieve a reliable connection between the semiconductor device and a next level substrate. A further explanation of how the hourglass shape achieves tight height volume control is provided below.

The dimensional limitation of conventional metal mask technology is due the manner in which hourglass shaped openings are formed. To achieve the hourglass shape, metal mask 10 is simultaneously etched from both a top surface 13 and from a bottom surface 14 of the mask. Prior to etching, top surface 13 of metal mask 10 is patterned with a resist mask using conventional lithography techniques. The pattern of the resist mask defines (either positively or negatively) portions of top surface 13 which are to be etched. Bottom surface 14 is likewise patterned with a resist mask; however, the pattern of the resist mask is a mirror image of that used on the top surface 13. The resist masks are mirror images of one another so that upon etching simultaneously from both sides of the mask, the portions etched from the top will meet and align with the portions etched from the bottom, thereby forming openings 12 which extend completely through mask 10. The etch used to define openings 10 is an isotropic etch which produces tapered sidewalls. The direction of the taper is inward from the direction of the etch. Since the etch is isotropic and performed from both the top and bottom surfaces, the openings 12 take on an hourglass shape as illustrated in FIG. 2.

With the foregoing etch and lithography techniques, metal masks such as mask 10 can be fabricated to form holes having a diameter of 125µ (5 mil) with a pitch of 250µ (10 mil). The hole diameter is typically measured as being the minimum opening diameter. For instance, in reference to FIG. 2, the diameter of openings 12 at either the top or bottom surface would be represented in FIG. 2 by "d". Pitch refers to the spacing between the center of adjacent openings and is represented in FIG. 2 as "p". While masks having 100µ (4 mil) opening diameters can be fabricated, the yield of producing such masks is significantly reduced. The reduction in yield results from processing limitations imposed by the diameter of the openings in relation to the thickness of the mask. At present, the aspect ratio between the opening diameter and the mask thickness (d/t) should be kept to a number greater than one (d/t>1) in order to achieve acceptable yield levels. As a result, the lower limit on opening diameter is restricted by the thickness of the metal mask.

With the demand for smaller and more dense devices, there is also a need for smaller and more dense conductive bumps formed on these devices. However with the bumping technique described above, the lower dimensions of the conductive bumps formed through this process are restricted by the thickness of the metal mask. An obvious solution to this problem is to simply reduce the mask thickness, thereby allowing the diameter of openings to likewise be reduced. However, this solution is not feasible because the thickness of the mask is also used to control the height and volume of metal deposited through the mask openings (as further explained below). By reducing the mask thickness, the height and volume of metal deposited to form the bumps is likewise reduced, adversely affecting the ability to reliably connect a bumped device to a next level substrate. Accordingly, an improved process for forming smaller conductive bumps to increase terminal density is desired.

DETAILED DESCRIPTION OF A PREFERRED EMBODIMENT

Figure 1:
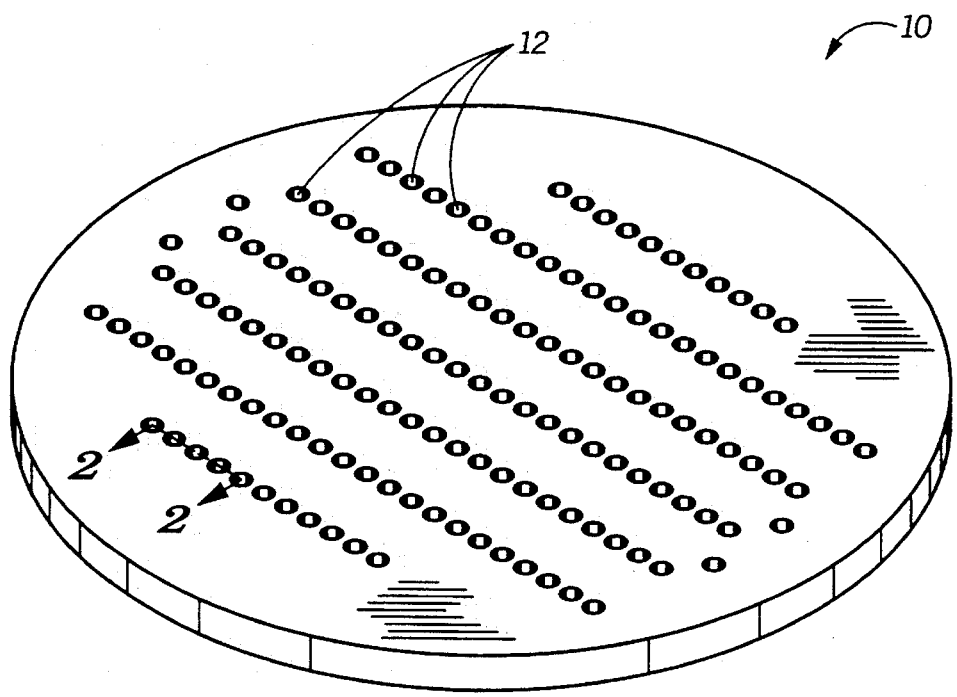
FIG. 1 is a perspective view of a metal mask used for evaporating metal to form conductive bumps on a semiconductor device as known in the prior art.

Generally, the present invention provides an improved process for forming conductive bumps on a semiconductor device using a mask structure. In one embodiment of the present invention, a mask structure includes two masks which are individually fabricated and subsequently positioned or connected to one another in a back-to-back relationship. A first mask is patterned and isotropically etched to form a plurality of openings which extend completely through the entire thickness of the first mask. The plurality of openings corresponds in pattern to the pattern of terminals on the semiconductor device onto which metal or other conductive material is to be deposited. A second mask is patterned and isotropically etched to form a plurality of openings which extend completely through the thickness of the second mask. The pattern of the openings in the second mask are a mirror image of the pattern of the openings in the first mask, such that upon placing the first and second masks in a back-to-back relationship, the pluralities of openings in the two masks are aligned with one another and correspond to the pattern of terminals on the semiconductor device to be bumped.

Using a mask structure having two individual masks enables smaller openings to be formed as compared to prior art processes because etching capabilities are limited by a smaller mask thickness. Each of the first and second masks used in a mask structure in accordance with the present invention has an individual mask thickness which is less than the thickness of a typical single mask used in a prior art process. The diameter of openings formed in each of the first and second masks of the mask structure is limited by the thickness of the individual masks rather than by the thickness of the overall mask structure. In theory, the diameter of openings of a mask formed in accordance with the present invention can be reduced by a factor of two as compared to the diameters of openings formed in prior art masks, assuming that the thickness of each of the first and second masks used in the mask structure is approximately one-half the thickness of a single prior art mask. In practice, the improvement may be slightly less than a factor of two since each of the first and second masks are subject to a one-sided etch, rather than a two-sided etch as prior art masks are fabricated. Aspect ratios achievable in one sided etching processes are somewhat larger than aspect ratios achievable using two sided etch processes. Nonetheless, the present invention provides a significant advantage over the use of conventional single masks in its ability to create openings through the mask structure wherein the aspect ratio in the overall mask structure is less than one.

These and other features and advantages of the present invention will be more clearly understood from the following detailed description taking in conjunction with the accompanying drawings. It is important to point out that the illustrations may not necessarily be drawn to scale, and that there may be other embodiments of the present invention which are not specifically illustrated. Throughout the drawings, like reference numerals are used to designate identical or corresponding parts.

Figure 2:
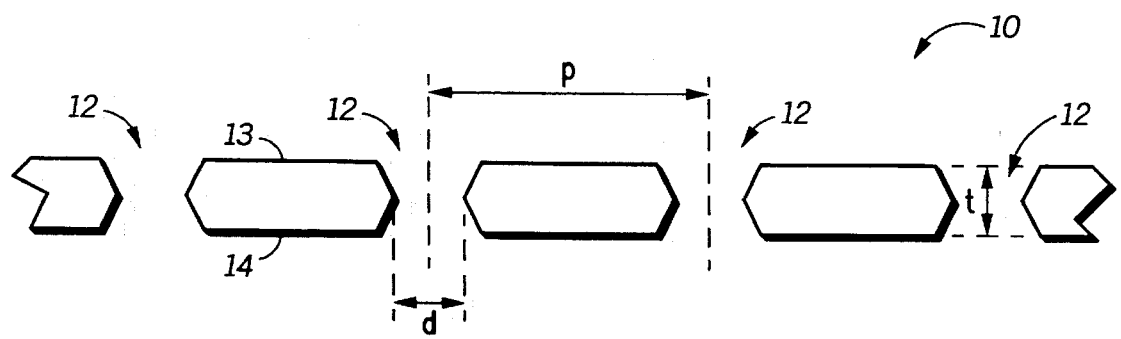
FIG. 2 is an exploded cross-sectional view of a portion of the metal mask illustrated in FIG. 1 taken along the line 2—2.
Figure 3:
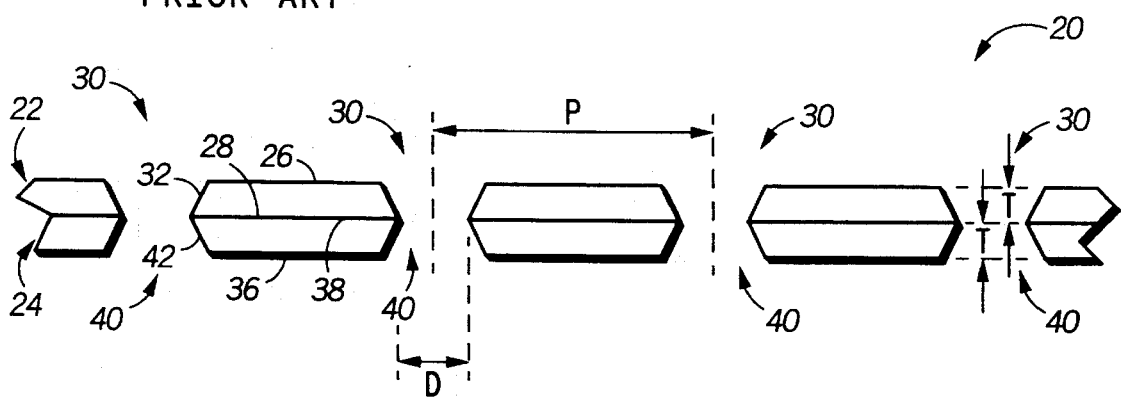
FIG. 3 is an exploded cross-sectional view of a portion of a mask structure which is used for forming conductive bumps on a semiconductor device in accordance with the present invention.

FIG. 3 illustrates in an exploded cross-sectional view a mask structure 20 as used and fabricated in accordance with the present invention. The view of mask structure 20 illustrated in FIG. 3 is comparable to the view of the prior art mask illustrated in FIG. 2. Mask structure 20 includes a first mask 22 and a second mask 24. First mask 22 and second mask 24 are individually fabricated and subsequently attached together to form mask structure 20. First mask 22 has a top surface 26 and a bottom surface 28. Further, first mask 22 includes a plurality of openings 30 extending between the top and bottom surfaces of the mask. First mask 22 is formed of conventional mask materials, including metal. Preferably the mask is made of molybdenum. First mask 22 is fabricated in accordance with conventional mask fabrication techniques. For example, the plurality of openings formed in the first mask is defined through a series of lithography and etching steps such as those used to pattern mask 10 illustrated in FIGS. 1 and 2. More specifically, a resist mask corresponding to the desired pattern of openings to be formed in the mask is used as an etch mask on top surface 26. Bottom surface 28 is entirely covered with a resist mask, wherein etching of mask 22 only occurs in one direction (from top to bottom). Etching can be accomplished, in the case of a molybdenum mask, using a ferrocyanide etch which will transpose the pattern of the resist mask into underlying first mask 22. The etch is preferably an isotropic etch such that upon etching, openings 30 have tapered sidewalls 32 substantially as illustrated in FIG. 3. The direction of the taper will correspond to the direction of the etch. In etching from top surface 26 through to bottom surface 28 of first mask 22, tapered sidewalls 32 will be tapered in an inward direction from top to bottom.

Second mask 24 is fabricated in the same manner as first mask 22, and includes a top surface 36, a bottom surface 38, and a plurality of openings 40. In fabricating second mask 24, the pattern of the plurality of openings 40 is a mirror image of the pattern of the plurality of openings 30 in first mask 22. Like first mask 22, second mask 24 is etched in one direction from the top surface 36 to the bottom surface 38 such that openings 40 have tapered sidewalls 42. Preferably, second mask 24 is formed of a same metal or material as first mask 22 and has a same thickness as first mask 22. The first mask and second mask are then positioned in a back-to-back nature, wherein the bottom surface 28 of the first mask is adjacent the bottom surface 38 of the second mask. In order for openings 30 to align to openings 40, the etched pattern in the masks must be mirror images of one another.

An advantage of being able to achieve smaller opening diameters, and therefore smaller opening pitches, is achieved in the present invention by employing two masks, each having a thickness (T), wherein T is approximately equal to one half the thickness of a conventional mask structure used for forming conductive. Conventional masks typically have thicknesses ranging from 100–150 µm (4–6 mils); therefore, masks used in a mask structure employing the present invention should preferably each have a thickness ranging from 50–75 µm (2–3 mils). By employing two individual masks, the aspect ratio of openings formed in an individual mask controls the ultimate diameter and pitch of the composite mask structure. In fabricating prior art masks, such as that illustrated in FIG. 2, the aspect ratio (d/t) must be held to approximately one or greater (d/t≧1) in order to achieve acceptable yield levels. This aspect ratio limitation is imposed by etching capabilities. However using these same etching capabilities, a greater effective aspect ratio can be achieved by combining two individual masks which each have an aspect ratio comparable to those of prior art masks. This concept is explained further in reference to FIG. 3. (It is noted that the effective aspect ratio of the mask structure in FIG. 3 is illustrated as being equal to the aspect ratio of the prior art mask for ease of illustration. In practice, the effective aspect ratio, and in particular the diameter of openings 30 and 40, will normally be smaller than those achievable with prior art masks.) The aspect ratio of etching an individual mask (either first mask 22 or second mask 24) is equal to D/T. Upon combining the first and second mask together, the effective aspect ratio is D/2T. If the minimum aspect ratio achievable by a mask etching process is equal to 1, then D/T≧1 in the fabrication of each of mask 22 or mask 24. However, since the effective aspect ratio is D/2T, the minimum aspect ratio in accordance with the present invention is 1/2. In other words, D/2T will be greater than or equal to 1/2, presuming that T is chosen to equal 1/2 t. With such an aspect ratio, D (the opening diameter) can be made to be smaller than the total mask structure thickness (2T), which in prior art masking techniques is difficult to achieve. The present invention provides a factor 2 improvement over typical prior art aspect ratios (a minimum aspect ratio of 1/2 in accordance with the present invention compared to a minimum aspect ratio of 1 in prior art processes). In practice a 2 factor improvement may not be had because masks 22 and 24 are made using a one-sided etch process, whereas prior art mask is manufactured using a two-sided etch process. Etching from two sides provides a lower aspect ratio than etching from one side. However, in etching masks 22 and 24, the resulting aspect ratio of each mask will approach that achievable in a two-sided etch process, resulting in effective mask structure aspect ratio which is nearly a 2 factor improvement over aspect ratios achievable in the prior art.

Despite the fact that the present invention requires fabrication of two individual masks, the number of fabrications steps needed to make mask structure 20, is only minimally increased. Fabrication of the mask structure in accordance with the invention will require two lithography exposure process steps, specifically one to pattern a resist mask to etch first mask 22 and another to pattern a resist mask to etch second mask 24. However, prior art masks, such as that illustrated in FIG. 2, likewise require two lithography exposure steps, namely one to pattern a resist mask on the top side of the mask and one to pattern a resist mask on the bottom side of the mask. Moreover, the fact that the opening pattern on the first and second masks of mask structure 20 are mirror images of one another does not impose additional fabrication steps or complexities. In forming prior art mask 10, mirror imaged patterns must also be employed. For example, the resist pattern that is placed on top surface 13 to etch openings 12 through mask 10 will not be the same pattern for a resist mask used to mask bottom surface 14 of the mask. Rather, the resist masks used on opposing surfaces 13 and 14 will be mirror images of one another so that the openings formed from etching each side will align, allowing passages to be formed through the entire mask thickness. Thus, the necessity of having to create mirror imaged patterns is present in both prior art processes and in the present invention.

The only additional fabrication step for making mask structure 20 as opposed to a single mask 10 is the positioning of first mask 22 and second mask 24 adjacent to one another in a back-to-back, or bottom-to-bottom, relationship and maintaining this positioning. In order to use mask structure 20 to deposit metal to form conductive bumps on a semiconductor die, it is important that openings 30 and openings 40 remain continually aligned throughout the bump formation process. Accordingly, it is desirable for first mask 22 and second mask 24 to be fixedly aligned to one another. Alignment is achieved in any of several methods. One method is to braze the two masks together. Brazing can be accomplished, in the case of molybdenum masks, by plating nickel onto selected regions of each mask, followed by plating a combination of gold and tin. The two masks are then aligned so that the plated portions are adjacent one another, and a heat treatment is used to form a metallurgical bond. As another alternative, one of masks could be fabricated to include alignment pins and the other mask could be fabricated to include alignment pin openings, such that the two masks would be aligned to one another and positioned by placing the alignment pins in the alignment openings. The alignment or connection of the two masks may be done either by the mask manufacturer or the semiconductor device manufacturer. Use of alignment pins is advantageous because it affords the ability to disassemble the two masks for easier mask cleaning after the bump processing.

Figure 4:
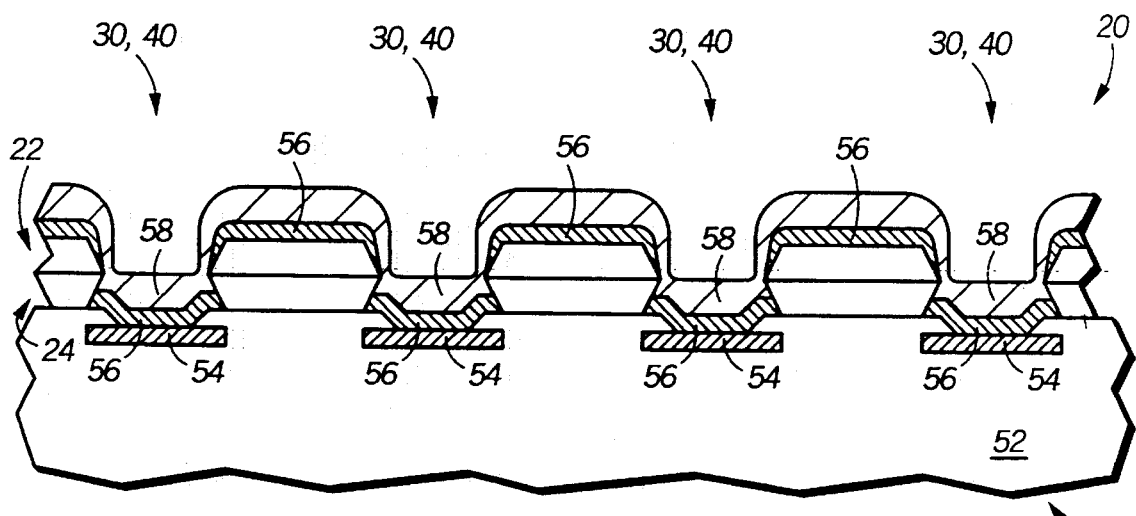
FIG. 4 is a cross-sectional view illustrating how the mask structure of FIG. 3 is used in conjunction with a semiconductor device to form conductive bumps on the device.
Figure 5:
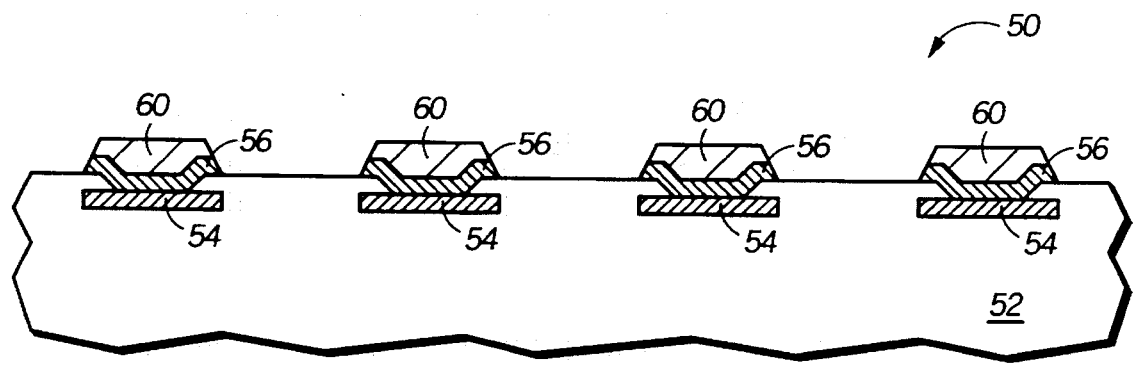
FIG. 5 is a cross-sectional illustration of the semiconductor device illustrated in FIG. 4 after the mask structure has been removed, leaving a plurality of conductive bumps.

FIGS. 4 and 5 illustrate how mask structure 20 is used in accordance with the present invention for forming conductive bumps on a semiconductor device 50. Semiconductor device 50 includes a semiconductor substrate 52 having a plurality of conductive input and output terminal pads 54 fabricated thereon. Preferably, substrate 52 is in the form of a semiconductor wafer, having a plurality of individual semiconductor die or devices formed thereon. In one embodiment of the present invention, terminal pads 54 are metal pads, such as aluminum pads, which are formed as either the final metallization of device 50 or as a redistribution metallization layer. Terminal pads 54 are connected to integrated circuitry (not shown) of device 50 to provide electrical access to the circuitry and allow device operation. Actual circuitry of device 50 is not illustrated for it is not necessary in understanding the present invention. The essence of such circuitry would include a variety of conductive layers and insulating layers interspersed between terminal pads 54 and underlying substrate 52.

In accordance with the present invention, conductive bumps are formed on terminal pads 54 using mask structure 20. As illustrated in FIG. 4, mask structure 20 is positioned over semiconductor device 50 such that openings 30 and 40 of the first mask and second mask align over terminal pads 54. Once aligned, the mask structure is preferably clamped to semiconductor device 50 in order to ensure that the openings remain in their proper positions over terminal pads 54. Such clamping mechanisms are well known and understood in the art and therefore will not be described. After aligning the mask structure to the device, a series of metals is evaporated through openings 30 and 40 onto terminal pads 54. During the evaporation process, metal(s) will also be deposited onto the top surface of mask structure 20, but this metal is removed upon removal of the mask structure as explained below. A first metal or series of metals is deposited to form a pad limiting metal layer 56. The pad limiting metal layer is used to provide adhesion and to serve as a barrier between terminal pads 54 and a subsequently deposited material. In a preferred embodiment of the present invention, a pad limiting metal layer is formed from a series of chrome, copper, and gold metals, evaporatively deposited through the openings in sequence. Since pad limiting metal layer 56 serves primarily for adhesion and barrier purposes, the layer need not be very thick (for example, 800–1500 nm). After depositing pad limiting metal layer 56, a primary metal 58 or series of metals is deposited through openings 30 and 40 of mask structure 20, as illustrated in FIG. 4. In a preferred embodiment of the present invention, primary metal 58 is actually a series of lead and tin deposited through the openings such that upon a subsequent refill reflow operation the primary metal turns to solder. Primary metal 58 is so called because it will serve as the primary material used for electrical and physical interconnection of semiconductor device 50 to a next level substrate. Primary metal 58 is deposited to a thickness sufficient to fill openings 40 in second mask 24.

FIG. 5 illustrates how mask structure 20, is used to control the volume of the conductive bumps. After depositing the primary metal 58, mask structure 20 is removed. In removing the mask structure, only that portion of the primary metal which was deposited within openings 40 of the second mask 24 remains on device 50, as illustrated in FIG. 5. Mask structure 20 is designed to include openings having tapered sidewalls such that the openings through the entire mask structure form an hourglass shape, wherein the diameter of the openings in the center of the mask is smaller than the diameter of the openings at either the top or the bottom of the mask structure. The same design is true of some prior art masks, such as that shown in FIG. 2. The hourglass opening shape provides a natural break between the primary metal 58 deposited on top of mask structure 20 and that deposited in the openings. This natural break allows the mask to be lifted away from underlying substrate 52 while leaving a controlled amount of deposited metal on the device. The metal remaining on top of the mask structure (and that remaining in openings 30) is cleaned from the mask structure, and the mask structure is reused for forming bumps on another device substrate or wafer.

By controlling the thickness and dimensions of the openings within both masks of the mask structure, the volume of conductive material or metal used to form conductive bumps can be tightly controlled. Specifically, the volume of each bump will be equal to the volume of each opening in second mask 24, which is a function of the diameter (D) and the thickness (T) as defined in FIG. 3. In practicing the present invention, conductive bumps 60 which are left on device 50 as a result of removing mask structure 20 will have a height above the upper surface of device 50 approximately equal to (T), the thickness of second mask 24. If (T) is chosen to be 1/2 the thickness of a prior art mask, the height of conductive bumps formed in accordance with the present invention will be the same as the same as the bumps formed in accordance with prior art processes. Thus, the present invention is compatible with accepted conductive bump dimensional standards. The diameter of conductive bumps 60 and the pitch, i.e. the center-to-center spacing of adjacent bumps, can be reduced to achieve more dense interconnection capability. Although reducing the diameter of conductive of bumps 60 will reduce the overall volume of conductive material to form the bumps, the thickness or height of the conductive bumps is more important in assuring a reliable connection process to a next level substrate.

The bumping process is finalized by reflowing conductive bumps 60. Upon reflowing, the conductive bumps will become somewhat spherical. Further, in the case of depositing lead and tin, the metals will alloy to form a solder composition. Device 50 is then ready for connection to a next level substrate (not shown) using any available direct chip attachment process.

The foregoing descriptions and illustrations contained herein demonstrate many of the advantages associated with the present invention. In particular it has been revealed that a mask structure used in accordance with the present invention can be used to form conductive bumps on a smaller pitch and having smaller diameters than conductive bumps made using conventional bump mask processes. The present invention achieves this advantage by employing a mask structure made up of two individual masks which are superimposed to one another in a back-to-back relationship. A mask structure used in accordance with the present invention has little additional fabrication steps, and therefore, is very cost competitive with the prior art masks. Another advantage of the present invention is that since the change over the prior art relates to mask design, the process used by a semiconductor manufacturer to form conductive bumps remains unchanged from conventional evaporative bumping methods, other than employing a different mask structure (unless the semiconductor manufacturer aligning the two individual masks together). The individual masks used to form a mask structure in accordance with the present invention employ the same materials and processing techniques used to form conventional masks, so that development costs for implementing the present invention are negligible.

Thus it is apparent that there has been provided, in accordance with the invention, a method of forming conductive bumps on a semiconductor device using a mask structure that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the individual mask thicknesses are not limited to being equal to 1/2 the thickness of conventional single masks used for the same purpose. Rather, the thickness of the individual mask will be governed by the volume or height of the conductive bump to be formed on the semiconductor device. Further, the diameter used to compare the aspect ratio of a mask structure of the present invention with another mask need not be the minimum diameter of the opening. In addition the invention is not limited to using a specific mask material to form the individual masks. Although molybdenum or other metal having a coefficient of thermal expansion similar to that of the semiconductor device is preferred for use in both masks, other mask materials may also be suitable. In addition, the invention is not limited to using specific etching techniques to form the openings in the masks. However, it is desirable for the etching process to be an isotropic etch process such that sidewalls of the openings will be tapered for ease in removing the mask structure while leaving the appropriate amount of conductive material on the semiconductor device. Furthermore, the present invention is not limited to any particular conductive material used to form the conductive bumps. While lead-tin solder is a suitable and preferred material for forming the bumps, other conductive materials such as indium-lead solder or other conductive material may be used instead. Moreover, it is not necessary that the conductive material which is used to form the bumps be evaporatively deposited. A screen printing or stencil printing process using the mask structure as a screen or stencil is also within the scope of the invention. It is also important to note that the present invention is not limited in any way to use on a particular type of semiconductor device. In its most useful form, the present invention will find applicability to semiconductor devices requiring large numbers of input and output connections, for example for microprocessors and application specific integrated circuit (ASIC) devices. However, it is understood that other devices, such as microcontrollers, digital signal processors, memory devices, logic devices, and the like will also find benefit from the present invention. Also, it is not necessary that a pad limiting metal be deposited in-between the primary metal used to form the conductive bumps and the terminal pads. The necessity of using such pad limiting metal will depend on the materials chosen for the individual elements. Therefore, it is intended that this invention encompass all such variations and modifications as fall within the scope of the appended claims.

I claim:

1. A method of forming conductive bumps on a semiconductor device using a mask structure, comprising the steps, of:

providing a semiconductor device having a plurality of conductive terminal pads;

providing a mask structure comprised of a first mask and a second mask, wherein the first mask has a first plurality of openings formed therethrough and the second mask has a second plurality of openings formed therethrough, wherein the first plurality of openings and the second plurality of openings correspond in position to the plurality of conductive terminal pads, wherein the first mask and the second mask are adjacently positioned such that the first plurality of openings and the second plurality of openings are aligned, and wherein each opening of the first plurality of openings has inwardly tapered sidewalls and each opening of the second plurality of openings has outwardly tapered sidewalls when the mask structure is viewed in cross-section;

positioning the mask structure over the semiconductor device such that the first plurality of openings and the second plurality of openings are in alignment with the plurality of conductive terminal pads;

depositing a conductive material through the first plurality of openings and the second plurality of openings and onto the plurality of conductive terminal pads;

removing the mask structure from the semiconductor device; and cleaning the mask structure for subsequent reuse.

2. The method of claim 1 wherein the step of providing a mask structure comprises providing a mask structure wherein the first mask and the second mask are both comprised of a same metal.

3. The method of claim 1 wherein the step of depositing a conductive material comprises evaporating a metal.

4. The method of claim 1 wherein the step of providing a mask structure comprises providing a mask structure wherein the first mask has a first thickness and the second mask has a second thickness substantially equal to the first thickness.

5. The method of claim 4 wherein the step of providing a mask structure comprises providing a mask structure wherein each opening of the first plurality of openings and of the second plurality of openings has a diameter, and wherein a sum of the first thickness and the second thickness is greater than the diameter.

6. The method of claim 1 wherein the step of removing the mask structure comprises removing the mask structure, after depositing the conductive material, to leave a volume of the conductive material on each terminal pad of the plurality of conductive terminal pads.

7. The method of claim 6 wherein the step of removing comprises removing the mask structure to leave a conductive material having a height on the semiconductor device, and wherein the height of the conductive material is approximately equal to a thickness of one of either the first mask and the second mask.

8. A method of forming conductive bumps on a semiconductor device using a mask structure, comprising the steps of:

providing a semiconductor device having a plurality of terminal pads on a surface thereof;

providing a mask structure comprised of a first mask and a second mask, wherein the first mask is comprised of:
   a first surface and a second surface; and
   a first plurality of openings formed between the first surface and the second surface, wherein the first plurality of openings corresponds in pattern to the plurality of terminal pads and wherein each opening of the first plurality of openings in the first mask has inwardly tapered sidewalls from the first surface to the second surface;

wherein the second mask is comprised of:
   a third surface and a fourth surface; and
   a second plurality of openings formed between the third surface and the fourth surface, wherein the second plurality of openings corresponds in pattern to a mirror image of the plurality of terminal pads and wherein each opening of the second plurality of openings in the second mask has inwardly tapered sidewalls from the third surface to the fourth surface; and wherein the first mask and the second mask are positioned together such that the second surface of the first mask is adjacent the fourth surface of the second mask, and such that the first plurality of openings and the second plurality of openings are aligned with one another to form a third plurality of openings extending through the mask structure;

positioning the mask structure over the semiconductor device such that the third plurality of openings is aligned over the plurality of terminal pads;

depositing a metal through the third plurality of openings and onto the plurality of terminal pads;

removing the mask from over the semiconductor device; and cleaning the mask structure for subsequent reuse.

9. The method of claim 8 wherein the step of providing a mask structure comprises providing a mask structure wherein the first mask and the second mask are comprised of metal.

10. The method of claim 9 wherein the step of providing a mask structure comprises providing a mask structure wherein the first mask and the second mask are comprised of molybdenum.

11. The method of claim 8 wherein the step of providing a mask structure comprises providing a mask structure wherein the first mask has a thickness and wherein each opening of the first plurality of openings has a diameter less than twice the thickness of the first mask.

12. The method of claim 8 wherein the step of depositing a metal comprises depositing a metal selected from a group consisting of: chromium, copper, gold, lead, and tin.

13. The method of claim 8 further comprising the steps of removing the mask structure and leaving a volume of the metal on each terminal pad of the plurality of terminal pads, and reflowing the metal to form a plurality of spherical bumps on the plurality of terminal pads.

14. A method of forming conductive bumps on a semiconductor device using a mask structure, comprising the steps of:

providing a semiconductor device having a plurality of terminal pads exposed on a surface thereof;

providing a mask structure comprised of a first mask and a second mask, wherein the first mask and the second mask each have a top surface, a bottom surface, and a plurality of openings extending between the top surface and the bottom surface, wherein each opening of the plurality of openings in the first mask and of the plurality of openings in the second mask has inwardly tapered sidewalls from the top surface to the bottom surface and wherein the second mask is fixedly positioned with the first mask such that the plurality of openings of the first mask are aligned to the plurality of openings of the second mask;

positioning the mask structure over the semiconductor device such that the plurality of openings of the first mask and the plurality of openings of the second mask align with the plurality of terminal pads;

depositing a conductive material through the plurality of openings of the first mask and the plurality of openings of the second mask and onto the plurality of terminal pads; and removing the mask structure from over the semiconductor device; and cleaning the mask structure for subsequent reuse.

15. The method of claim 14 wherein the step of providing a mask structure comprises providing a mask structure wherein the first mask and the second mask are positioned such that the inwardly tapered sidewalls of each opening of the plurality of openings of the first mask and the inwardly tapered sidewalls of each opening of the plurality of openings of the second mask cooperate to form a plurality of hourglass-shaped openings through the mask structure.

16. The method of claim 14 wherein the step of providing a mask structure comprises providing a mask structure wherein the first mask has a first thickness and the second mask has a second thickness substantially equal to the first thickness, and wherein each opening in the first mask and in the second mask has a diameter, and wherein each diameter is less than a sum of the first thickness and the second thickness.

17. The method of claim 14 wherein the step of depositing a conductive material comprises evaporating a metal selected from a group consisting of: chromium, copper, gold, lead, and tin.

* * * * *